(12) United States Patent
Park

(10) Patent No.: US 6,936,880 B2
(45) Date of Patent: Aug. 30, 2005

(54) CAPACITOR OF SEMICONDUCTOR MEMORY DEVICE AND METHOD OF MANUFACTURING THE SAME

(75) Inventor: Jong Bum Park, Ichon-Shi (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 10/323,516

(22) Filed: Dec. 18, 2002

(65) Prior Publication Data

US 2003/0087501 A1 May 8, 2003

Related U.S. Application Data

(62) Division of application No. 09/887,213, filed on Jun. 22, 2001, now Pat. No. 6,518,120.

(30) Foreign Application Priority Data

Jun. 28, 2000 (KR) .......................................... 2000-36049

(51) Int. Cl.[7] ...................... H01L 27/108; H01L 29/76; H01L 29/94; H01L 31/119
(52) U.S. Cl. ...................... 257/306; 257/301; 257/310
(58) Field of Search ................................ 257/301, 306, 257/310, 308, 307, 295

(56) References Cited

U.S. PATENT DOCUMENTS

| | | | |
|---|---|---|---|
| 5,593,495 A | | 1/1997 | Masuda et al. |
| 6,150,689 A | * | 11/2000 | Narui et al. ................. 257/306 |
| 6,300,652 B1 | * | 10/2001 | Risch et al. ................. 257/296 |
| 6,320,244 B1 | * | 11/2001 | Alers et al. ................. 257/534 |
| 6,326,258 B1 | * | 12/2001 | Iizuka ......................... 438/239 |
| 2001/0025977 A1 | | 10/2001 | Hieda |
| 2001/0036752 A1 | | 11/2001 | Deboer et al. |
| 2002/0019109 A1 | * | 2/2002 | Iizuka ......................... 438/396 |
| 2002/0030217 A1 | | 3/2002 | Hong |
| 2002/0153554 A1 | * | 10/2002 | Kajita et al. ................. 257/306 |
| 2002/0185671 A1 | * | 12/2002 | Kim ............................ 257/301 |

* cited by examiner

*Primary Examiner*—Nathan J. Flynn
*Assistant Examiner*—Victor A. Mandala, Jr.
(74) *Attorney, Agent, or Firm*—Marshall, Gerstein & Borun LLP

(57) ABSTRACT

A capacitor and a method of manufacturing the same are disclosed. The BST dielectric film is disposed between the lower electrode by coating a sidewall of the upper electrode and then forming the lower electrode in a second contact hole defined by the upper electrode and BST film. As such, degradation in the step coverage characteristic caused by forming a BST dielectric film having a desired composition ratio is avoided.

14 Claims, 3 Drawing Sheets

CAPACITOR OF SEMICONDUCTOR MEMORY DEVICE AND METHOD OF MANUFACTURING THE SAME

This is a Divisional of U.S. application Ser. No. 09/887,213, filed Jun. 22, 2001 now U.S. Pat. No. 6,518,120.

BACKGROUND OF THE INVENTION

1. Field of the Invention

The invention relates generally to a capacitor and a method of manufacturing the same. More particularly, the disclosed to a capacitor and a method of manufacturing the same, which can improve the step coverage of a BST dielectric film formed by a MOCVD method and that can prevent a change in the composition ratio to improve the dielectric characteristic of a capacitor.

2. Description of the Prior Art

The use of a high dielectric BST thin film as a capacitor material for Giga DRAMs has been studied. In a device having the cell size of less then $0.10\ \mu m^2$, even though the BST thin film is used as a dielectric material, a lower electrode must be formed in a three-dimensional structure or a capacitor must be formed with a concave structure. At this time, if the structure is etched using a noble metal such as Pt, Ru, Ir, etc. in order to form a lower electrode, the upper portion of the lower electrode is not etched with a vertical profile of 90°. It is at most etched with a non-vertical profile of about 80°. Therefore, it is impossible to use this method in a cell of that is smaller than $0.10\ \mu m^2$.

As a result, in order to solve this problem, a capacitor with a concave structure must be manufactured. At this time, in order to form such an electrode and a dielectric film, it is necessary that the CVD method have good step coverage. However, the types of precursors for the Pt CVD being developed now have been limited and they are also expensive. Therefore, it is economical to use a Ru precursor due to its lower cost. The capacitor manufactured thus is mainly used to store data in a DRAM.

FIG. 1 is a cross-sectional view for explaining a method of manufacturing a conventional capacitor. A first insulating film 2 is formed on a semiconductor substrate 1 in which various components for forming a semiconductor device are formed. Then, a contact hole is formed so that a given junction can be exposed. Next, a polysilicon layer for contact plug 3 is formed within the contact hole and is then flatten by chemical mechanical polish process, thus forming a $Si_3N_4$ film 6 and a second insulating film 7 on the entire structure.

Thereafter, a given region of the second an insulating film 7 is etched to form an opening wider than the contact hole, while exposing the polysilicon plug 3. Then, barrier layers 4 and 5, and a Ru lower electrode 8 are formed at the sidewall and at the bottom of the opening. Next, a BST dielectric film 9 and an upper electrode 10 are formed on the entire structure thereby covering the Ru lower electrode 8.

Conventionally, with a method of manufacturing a capacitor having a concave structure, the area of the lower electrode occupies less than 10% of the total wafer area. In other words, seeing the surface of the wafer before a MOCVD BST dielectric film is formed, most of the surface is a $SiO_2$ film being an insulating layer and the lower electrode occupies a very small area.

However, the BST dielectric film is made of 4-element series such as Ba, St, Ti and $O_2$, and if it is formed by CVD method, the composition ratio of a thin film is different depending on the condition of an underlying substrate. Also, in a capacitor of a concave structure or a stacked structure, as the cell size of the BST dielectric film is reduced even though it is deposited by a CVD method, the aspect ratio becomes relatively larger, thus significantly degrading the step coverage characteristic.

In a conventional concave structure, the step coverage after the MOCVD BST dielectric film is deposited is at most about 50%, which significantly makes it difficult to manufacture a capacitor structure in a capacitor having the cell size of $0.1\ \mu m^2$. That is, in case of a concave structure, as BST of a vapor state, made of 4-element series such as Ba, St, Ti and $O_2$ enters holes to form a BST dielectric film, a poor step coverage results in comparison to TiN or other thin films. Even in the case that the lower electrode has a stack structure, as most of the wafer is a $SiO_2$ film and an electrode occupies a very small area, the step coverage due to the difference of temperature is poor. Further, in case that the composition ratio of the BST dielectric film is different, it may have a critical affect on the electrical characteristics of a capacitor.

However, in the case that a lower electrode of a conventional capacitor is formed, if a MOCVD BST dielectric film is to be formed, the composition ratio of a BST dielectric film deposited on a $SiO_2$ and a BST dielectric film deposited on a lower electrode will be different. Also, as the composition ration of the BST dielectric film deposited on the lower electrode is different from that expected, a capacitor having a good electrical property cannot be obtained. Thus, in order to form a BST dielectric film having a desired composition ratio, the process temperature must be increased. In that case, a TiN/Ti film used as a diffusion barrier layer is oxidized, and particles are inevitably generated during the process of forming a BST dielectric film.

SUMMARY OF THE DISCLOSURE

A capacitor and method of manufacturing the same are disclosed, which can improve the step coverage of a BST dielectric film and improve the electrical characteristics of the capacitor by making its composition ratio constant, in such a way that the upper electrode is formed at a position so that a $SiO_2$ film remains in a conventional lower electrode structure. And, a BST dielectric film is formed between the upper electrode and the lower electrode without contacting the $SiO_2$ film.

One disclosed method of manufacturing a capacitor is characterized in that it comprises the steps of providing a semiconductor substrate in which a first insulating film through which a junction is open by a contact hole is formed, forming a contact plug within the contact hole, sequentially forming a $Si_3N_4$ film and a second insulating film on the entire structure, etching the second insulating film by etching process using an upper electrode mask to form an opening, forming an upper or first vertical electrode within the opening, removing the second insulating film and then forming a BST dielectric film at the sidewall of the upper electrode, removing the $Si_3N_4$ film on the contact plug, and forming noble metals for a lower or second vertical electrode on the entire structure and then performing a chemical mechanical polish process to form a lower electrode.

In the above method, the contact plug is formed using a plug method by which TiN is covered in a TiN/TiSi/Poly-Si structure. Two-element nitride-series materials or three-element nitride-series materials such as TiSiN, TiAlN are used instead of a diffusion barrier layer of a TiN film and a TiN film.

The Si$_3$N$_4$ film is formed with a thickness of about 500 Å.

The second insulating film is formed with a thickness ranging from about 5000 Å to about 15000 Å.

The first electrode and the second electrode are formed with a height ranging from about 500 Å using noble metals such as Pt, Ru, RuOx, Ir and IrOx by means of a CVD method.

The BST dielectric film is formed with a thickness ranging from about 150 Å to about 300 Å by a CVD method. After the BST dielectric film is formed, a RTA process is performed at a temperature ranging from about 700° C. to about 800° C. under a nitrogen atmosphere or a vacuum to crystallize the BST dielectric film. After the BST dielectric film is formed, a RTA process is performed under an oxygen atmosphere at a temperature ranging from about 350° C. to about 550° C. or a N$_2$O plasma process or an ultraviolet ozone UV-O$_3$ process is carried out to compensate for oxygen loss within said BST dielectric film.

A capacitor is characterized in that it comprises a first insulating film formed on a substrate, a contact plug formed within the first insulating film, a first vertical electrode formed above the first insulating film, a dielectric film formed on the vertical sidewall of the first electrode, and a second vertical electrode formed above the contact plug with the dielectric layer vertically sandwiched between the first and second electrodes.

BRIEF DESCRIPTION OF THE DRAWINGS

The aforementioned aspects and other features of the disclosed methods will be explained in the following description, taken in conjunction with the accompanying drawings, wherein.

DETAILED DESCRIPTION OF THE PRESENTLY PREFERRED EMBODIMENTS

The disclosed methods will be described in detail with reference to accompanying drawings. FIGS. 2A to 2F are cross-sectional views for explaining the disclose method of manufacturing a capacitor.

Figure 2A:
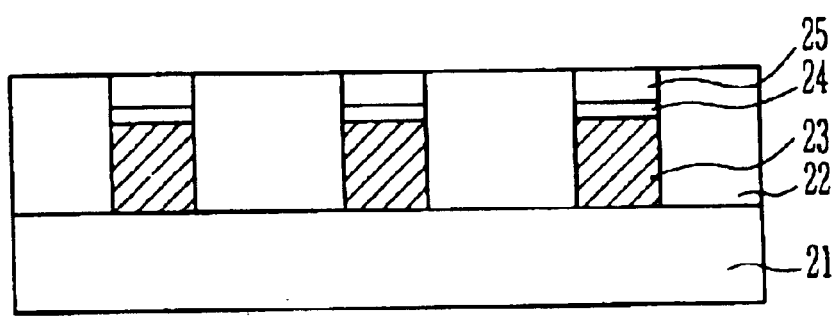
FIGS. 2A through 2F are cross-sectional views illustrating a disclosed method of manufacturing a capacitor.

Referring now to FIG. 2A, after a first insulating film 22 is formed on a semiconductor substrate 21 in which various components for forming a semiconductor device are formed, a contact hole is formed so that a junction can be exposed. Then, contact plugs 23 through 25 are formed within the contact hole using TiN capped plug method with TiN/TiSi/Poly-Si.

The TiN capped plug method with TiN/TiSi/Poly-Si will be now explained. First, a polysilicon layer 23 is formed to fill a portion of a contact hole. Then, after Ti is formed on the polysilicon layer 23, it is exposed to a thermal process to form a TiSi film 24. Then, unreacted Ti is removed and a portion of the contact hole is again coated. Next, a TiN film 25 is formed at the remaining portions of the contact hole to completely fill the contact hole. As such, after the contact plugs 23 through 25 are formed, the surface of the first insulating film 22 is flattened by chemical mechanical polish process. The TiSi film and the TiN 24 and 25 are diffusion barrier layers for preventing reaction with the lower electrode to be formed by a subsequent process. The diffusion barrier layers 24 and 25 may be formed of two-element nitride-series materials or three-element nitride-series materials such as TiSiN, TiAlN, etc. for increasing oxidization resistance.

Figure 2B:
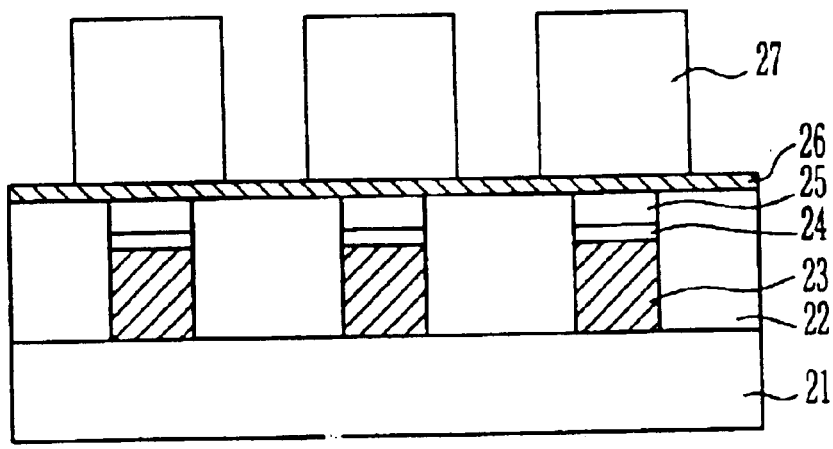

Referring now to FIG. 2B, a Si$_3$N$_4$ film 26 and a second insulating film 27 are sequentially formed on the first insulating film 22 including the TiN film 25. Then, the second insulating film 27 is etched using an upper electrode mask to form an opening.

The Si$_3$N$_4$ film 26 is formed with a thickness of about 500 Å, which prevents a lower layer when the second insulating film 27 is etched during a subsequent process. The second insulating film 27 is formed in thickness ranging from about 5000 Å to about 15000 Å.

Figure 2C:
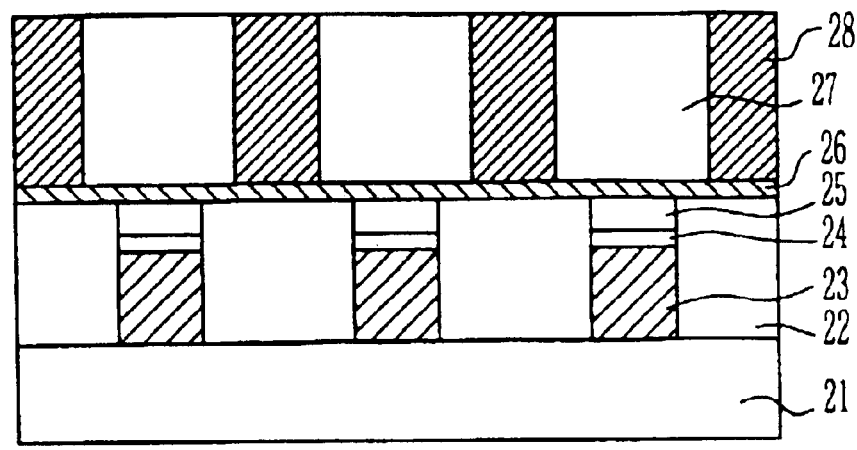

Referring now to FIG. 2C, a first vertical electrode 28 is formed within the opening by means of a CVD method.

The upper electrode 28 is formed, in such a way that it is formed on the entire structure including the second insulating film 27 using noble metals having a large work function such as Pt, Ru, RuOx, Ir and IrOx, etc. and each of the noble metals for an upper electrode on the second insulating film 27 are then partially removed by etch-back process or chemical mechanical polish process. The height of the first electrode 28 must be more than about 5000 Å and can achieve a desired capacitance for a cell size of 0.1 $\mu$m$^2$. If the first electrode is formed without first forming the second insulating film and then etching the second insulating film, for a cell size of 0.1 $\mu$m$^2$, the upper portion of the noble metals will be slanted when the noble metals for the upper electrode are etched. In order to overcome this problem, after a SiO$_2$ film 27 having a vertical etch profile is formed and is then etched, if the first electrode 28 is formed, a first electrode 28 having almost vertical shape can be obtained.

Figure 2D:
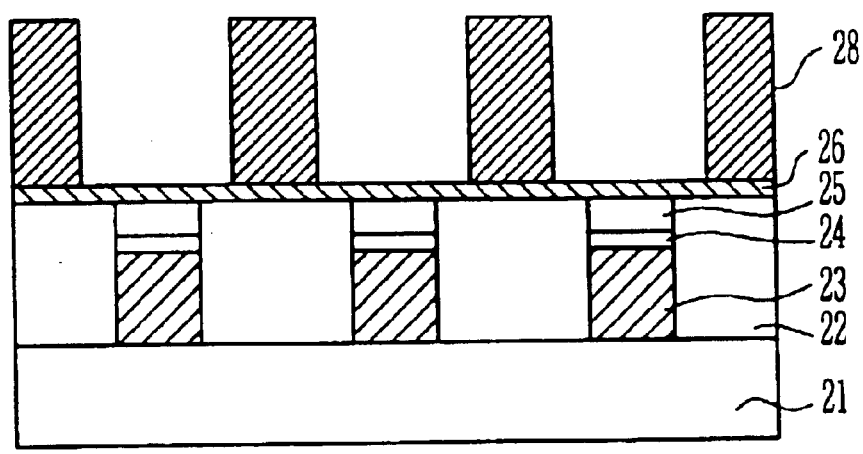

Referring now to FIG. 2D, the second insulating film 27 between the first electrodes 28 is removed.

Figure 2E:
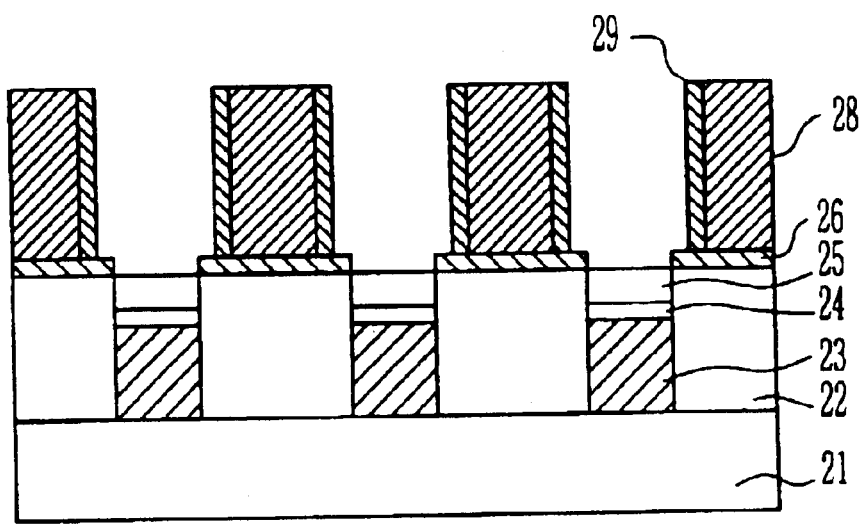

Referring now to FIG. 2E, a BST film is formed on the entire structure including the first electrodes 28 by means of CVD method. Then, in order to crystallize the BST film, a RTA process is performed. In order to compensate for oxygen escaped during the process is preformed. In order to compensate for oxygen escaped during the process of crystallizing the BST film, a rapid temperature annealing (RTA) process is performed. Thereafter, the BST film remains only at the sidewalls of the first electrodes 28 by an anisotropy etch process, thus forming a BST dielectric film 29.

The RTA process for crystallizing the BST film is performed under nitrogen atmosphere at a temperature ranging from about 700° C. to about 800° C. The crystallization process of the BST film may be performed after the BST film on the upper electrodes 28 is removed. The RTA process for compensating for oxygen loss within the BST film may be performed under an oxygen atmosphere at a temperature ranging from about 350° C. to about 550° C. or may be performed by a N$_2$O plasma process or ultraviolet ozone UV-O$_3$ process. The BST dielectric film 29 is formed with a thickness ranging from about 150 Å to about 300 Å. The RTA process for compensating for oxygen within the BST film may be performed after the BST film on the upper electrodes 28 is removed.

Figure 2F:
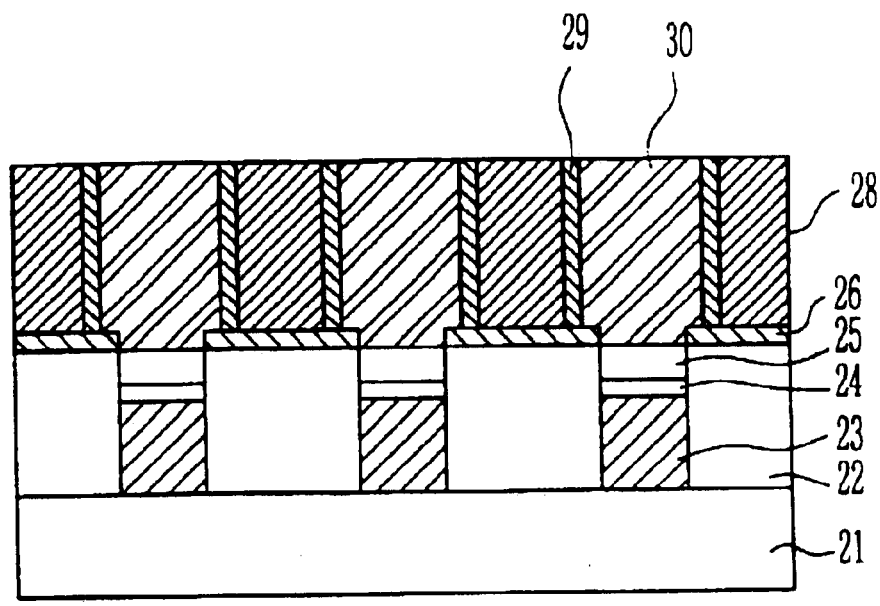

Referring now to FIG. 2F, after the Si$_3$N$_4$ film 26 on the TiN film 25 is etched, a second electrode 30 is formed.

The lower electrode 30 is formed in such a manner that the noble metals such as Pt, Ru, RuOx, Ir and IrOx, etc., which constitute the first electrode 28, are formed on the entire structure and each of the noble metals on the upper electrode 28 and the BST dielectric film 29 are then removed. After the second electrode 30 is formed, the RTA process for compensating for oxygen within the vertical BST dielectric film 29 may be performed.

Figure 1:
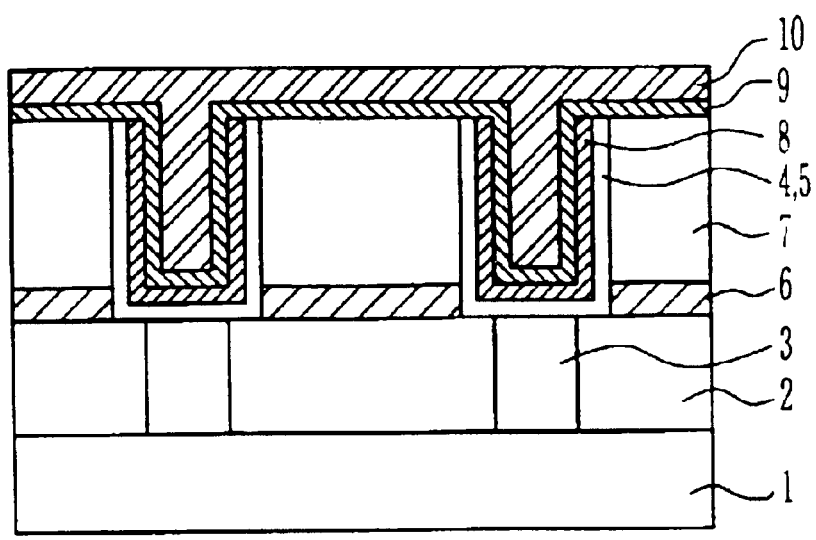
FIG. 1 is a cross-sectional view illustrating a prior art method of manufacturing a conventional capacitor.

In the disclosed method, in order to solve the step coverage and composition problems in the BST dielectric film 29, the portion of the SiO$_2$ film 27 remaining in the conventional structure is replaced by an upper electrode 28 of the capacitor. This process technology can solve the problem that the composition of the CVD BST dielectric film is changed since most of the wafer is covered with electrode materials. Also, it can reduce generation of particles since it can adjust the composition of a thin film even the BST film is formed at a low temperature by a CVD method. As the capacitor is formed by the disclosed method, the step coverage problem is solved. That is, as the capacitor structure is not in a hole shape but a vertical structure, with side walls as shown in FIGS. 2D and 2E, and most of the wafer surface on which a BST film is deposited is covered with electrode materials unlike the conventional stacked structure as shown in FIG. 1. As a result, the BST film can be uniformly formed since there is no temperature differential across the wafer surface.

As mentioned above, the disclosed method can improve the step coverage characteristic by making the structure of a capacitor different. The disclosed method can also improve an electric characteristic of a capacitor since it can make a desired composition of a BST dielectric film.

The disclosed method has been described with reference to particular embodiments in connection with particular applications. Those having ordinary skill in the art and access to the teachings of the disclosed method will recognize additional modifications and applications within the scope thereof.

It is therefore intended by the appended claims to cover any and all such applications, modifications, and embodiments within the scope of the disclosed method.

What is claimed:

1. A capacitor comprising:
   a first insulating film formed on a substrate;
   a contact plug formed within said first insulating film;
   a first vertical electrode formed above the first insulating film and staggered with respect to the contact plug, the first vertical electrode having a sidewall, the first vertical sidewall being used for an upper electrode of a capacitor;
   a vertical dielectric film formed on the vertical sidewall of the first vertical electrode; and
   a second vertical electrode formed on top of the contact plug and formed at one side of the vertical dielectric film so that the vertical dielectric film is sandwiched between the first and second vertical electrodes,
   the second vertical electrode being used as a lower electrode of the capacitor,
   wherein a top surface of the second vertical electrode is of the same level as that of the first vertical electrode.

2. The capacitor according to claim 1, wherein the contact plug comprises a TiN/TiSi/Poly-Silicon structure.

3. The capacitor according to claim 1, wherein the first vertical electrode and the second vertical electrode are formed of noble metals selected from the group consisting of Pt, Ru, RuOx, Ir and IrOx.

4. The capacitor according to claim 1, wherein the dielectric film is formed with a BST dielectric film.

5. The capacitor according to claim 1, wherein a silicon nitride layer is disposed between the first vertical electrode and the first insulating film.

6. The capacitor according to claim 2, wherein the upper first vertical electrode and the second vertical electrode are formed of noble metals selected from the group consisting of Pt, Ru, RuOx, Ir and IrOx.

7. The capacitor according to claim 6, wherein the dielectric film is formed with a BST dielectric film.

8. The capacitor according to claim 7, wherein a silicon nitride layer is disposed between the first vertcal electrode and the first insulating film.

9. A capacitor comprising:
   a first insulating film formed on a substrate;
   a contact plug formed within the first insulating film;
   a first vertical first electrode formed above the first insulating film, the first vertical electrode having a vertical sidewall;
   a vertical dielectric film formed on the vertical sidewall of the first vertical electrode;
   a second vertical electrode formed on the contact plug and formed at one side of the dielectric film so that the vertical dielectric film is sandwiched between the first and second vertical electrodes;
   wherein a top surface of the second vertical electrode is of the same level as that of the first vertical electrode; and
   wherein the contact plug comprises a TiN/TiSi/Poly-Silicon structure.

10. The capacitor according to claim 9, wherein the dielectric film is formed with a BST dielectric film.

11. The capacitor according to claim 9, wherein a silicon nitride layer is disposed between the first vertical electrode and the first insulating film.

12. The capacitor according to claim 9, wherein the first vertical electrode and the second vertical electrode are formed of noble metals selected from the group consisting of Pt, Ru, RuOx, Ir and IrOx.

13. The capacitor according to claim 12, wherein the dielectric film is formed with a BST dielectric film.

14. The capacitor according to claim 12, wherein a silicon nitride layer is disposed between the first vertical electrode and the first insulating film.

* * * * *